United States Patent [19]
Shindo

[11] Patent Number: 5,656,511
[45] Date of Patent: Aug. 12, 1997

[54] MANUFACTURING METHOD FOR SEMICONDUCTOR DEVICE

[75] Inventor: Hitoshi Shindo, Atsugi, Japan

[73] Assignee: Canon Kabushiki Kaisha, Tokyo, Japan

[21] Appl. No.: 400,009

[22] Filed: Mar. 6, 1995

Related U.S. Application Data

[63] Continuation of Ser. No. 831,756, Feb. 10, 1992, abandoned, which is a continuation of Ser. No. 572,388, Aug. 27, 1990, abandoned.

[30] Foreign Application Priority Data

Sep. 4, 1989 [JP] Japan .................................. 1-229085

[51] Int. Cl.⁶ ..................... H01L 29/786; H01L 21/365; H01L 21/385; H01L 21/428
[52] U.S. Cl. ......................... 438/160; 438/162; 438/535
[58] Field of Search ......................... 437/21, 40, 41, 437/101, 160, 162, 163, 165, 233, 164, 170, 172, 173, 929, 907, 908; 148/DIG. 91

[56] References Cited

U.S. PATENT DOCUMENTS

| | | | |
|---|---|---|---|
| 4,459,739 | 7/1984 | Shepherd et al. | 357/23.7 |
| 4,619,034 | 10/1986 | Janning | 437/21 |
| 4,624,737 | 11/1986 | Shimbo | 156/643 |
| 4,650,524 | 3/1987 | Kiyama et al. | 437/191 |
| 4,700,458 | 10/1987 | Suzuki et al. | 437/41 |
| 4,727,044 | 2/1988 | Yamazaki | 437/101 |
| 4,733,284 | 3/1988 | Aoki | 357/23.7 |
| 4,746,628 | 5/1988 | Takafuji et al. | 437/101 |
| 4,849,797 | 7/1989 | Ukai | 357/4 |
| 4,859,908 | 8/1989 | Yoshida et al. | 204/298.37 |

FOREIGN PATENT DOCUMENTS

| | | |
|---|---|---|
| 0071244 | 9/1983 | European Pat. Off. . |
| 0090661 | 10/1983 | European Pat. Off. . |
| 0413982 | 2/1991 | European Pat. Off. ............... 437/160 |
| 0430167 | 6/1991 | European Pat. Off. ............... 437/160 |
| 0430168 | 6/1991 | European Pat. Off. ............... 437/160 |
| 58-186949 | 11/1983 | Japan . |
| 0061183 | 4/1984 | Japan . |
| 0048979 | 3/1986 | Japan .................................... 437/165 |
| 0224364 | 10/1986 | Japan .................................... 437/165 |
| 0014472 | 1/1987 | Japan .................................... 437/165 |
| 63-115384 | 5/1988 | Japan . |
| 63-167767 | 7/1988 | Japan . |
| 0027271 | 1/1989 | Japan ...................................... 437/41 |
| 0183854 | 7/1989 | Japan ...................................... 357/23.7 |
| 2-66938 | 3/1990 | Japan .................................... 437/160 |

OTHER PUBLICATIONS

Sugioka et al., "Direct Formation of Three–Dimensional Strutures in GaAs by Excimer Laser Doping", Jap. J. Appl. Phys., vol. 28, No. 10, Oct., 1989, pp. 2162–2166. 1989.

Pressley, "Gas Immersion Laser Diffusion (GILDing), from Laser Processing of Semiconductor Devices", C.C. Tang, ed., Proc. SPIE, vol. 385, 1983, pp. 30–31. 1983.

*Primary Examiner*—Mary Wilczewski
*Attorney, Agent, or Firm*—Fitzpatrick, Cella, Harper & Scinto

[57] ABSTRACT

A manufacturing method for a semiconductor device is preferably used for a semiconductor device using SOI (Silicon on Insulation) technology. At minimum, the method includes the following steps: the step of forming a gate electrode on a substrate by using a light-intercepting material; of forming a gate insulating film on the substrate including the gate electrode; of forming a semiconductor layer on the gate insulating film; and of forming a source region and a drain region by virtue of the fact that light, having a wavelength such that the light is absorbed into the semiconductor layer while not being absorbed into the substrate, is irradiated from the back of the substrate, before supplying impurities into the semiconductor layer.

10 Claims, 3 Drawing Sheets hν hν

MANUFACTURING METHOD FOR SEMICONDUCTOR DEVICE

This application is a continuation of application Ser. No. 07/831,756 filed Feb. 10, 1992, which is a continuation of Ser. No. 07/572,388 filed Aug. 27, 1990, both now abandoned.

BACKGROUND OF THE INVENTION

1. Field of the Invention

The present invention relates to a manufacturing method for a semiconductor device, and more particularly to a manufacturing method preferably used for a semiconductor device using SOI (Silicon on Insulation) technology.

2. Related Background Art

Conventionally, SOIs are known in a broad sense as technology, such as single crystal SOIs, used mainly in high-speed or three-dimensional ICs, and TFTs (Thin Film Transistors) which use thin film semiconductor layers, such as poly-Si or a-Si, and are mainly and preferably used as driving transistors for contact reading sensors or liquid crystal displays.

In the above technology, TFTs have conventionally gained attention in terms of low cost and the fact that they can be manufactured on large area substrates. However, recent demands for high performance and high precision contact reading sensors and the like have required TFTs with superior characteristics.

As a method of accomplishing such superior characteristics, the quality of a semiconductor layer of the TFT is improved to approach a single crystal. TFTs using poly-Si, with mobility higher than that of a-Si, have been recently realized.

Although endeavors have been made to improve the performance of the conventional TFT, the current conventional TFT, having a semiconductor layer formed by the poly-Si, is behind the single crystal SOI in terms of gain and leakage current characteristics. Furthermore, in contrast to the above single crystal SOI, in which seeds (seed crystals) are obtained from a single crystal substrate called SEG (Selective Epitaxial Growth) or LSPE, it is difficult for the TFT to grow a single crystal layer on the entire face of a glass substrate. For these reasons, as a method of improving the TFT characteristics, improvements in a device structure based on the manufacturing process have gained attention.

For example, in the conventional stacking process, as illustrated in FIG. 1, which is a schematic cross-sectional view, the semiconductor device in accordance with the conventional SOI is constructed in the following manner. A source region 2a as well as a drain region 2b, are previously formed on an insulating film. A semiconductor layer 3 and a gate insulating film 4 are then formed on the upper layer of the regions, followed a gate electrode 5 being formed on the upperlayer of the gate insulating film 4.

The construction such as the above one, however, poses problems in that variations in the effective gate length increase, and that the amount of overlapping between the gate and the drain also increases. For these reasons, in a semiconductor device in which an active element and a drive element are integrated with each other, when the manufacturing process inevitably generates an overlapped portion between the semiconductor layer 3 and the gate electrode 5, as in the TFT construction shown in FIG. 1, this overlapped portion assumes parasitic capacitance in driving the elements, thereby hindering high-speed driving.

To overcome such problems as the above ones, it is possible to adopt a process, such as a self alignment, which is utilized as a conventional IC process. In this case, the structure of a semiconductor device is, for example, like the one illustrated in FIG. 2, which is a schematic cross-sectional view. Direct introduction of the conventional IC process, such as the self alignment, however, causes the process to be complicated, and is not suitable for a glass substrate because of the need for a high temperature process. This leads to the foremost problem of increased cost of the semiconductor. In addition, as illustrated in FIG. 2, a problem exists in that since an ion implantation process and a heat diffusion process are performed on the semiconductor layer 3 in order to form the source region 2a and the drain region 2b, diffusion takes place in a horizontal direction, not allowing the elimination of the overlapped parasitic capacity.

SUMMARY OF THE INVENTION

The present invention is directed to the problems pertaining to the conventional art hitherto described. An object of the present invention is to propose a manufacturing method for a semiconductor device which provides inexpensive TFTs enabling high-speed operations.

An object of the present invention is to propose a manufacturing method for a semiconductor device, comprising at least the steps of: forming a gate electrode on a substrate by using a light-intercepting material; forming a gate insulating film on the substrate including the gate electrode; forming a semiconductor layer on the gate insulating film; and forming a source region and a drain region by virtue of the fact that light, having a wavelength such that the light is absorbed into the semiconductor layer, while not being absorbed into the substrate, is irradiated from the back of the substrate, before supplying impurities into the semiconductor layer.

Other features will become apparent from the following Description of the Preferred Embodiments when read with reference to the accompanying drawings.

DESCRIPTION OF THE PREFERRED EMBODIMENTS

Figure 1:
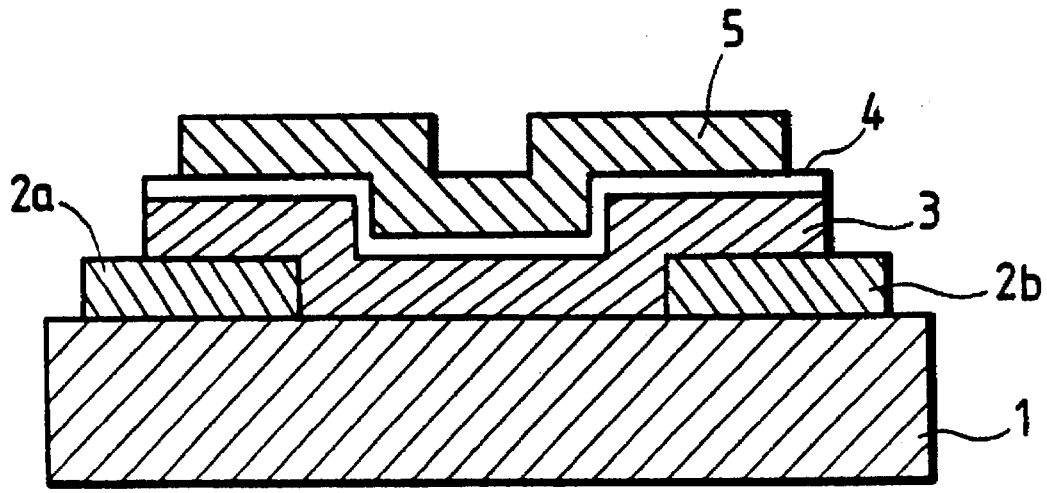
FIGS. 1 and 2 are schematic cross-sectional views explaining a semiconductor device according to the conventional SOI technology.
Figure 2:
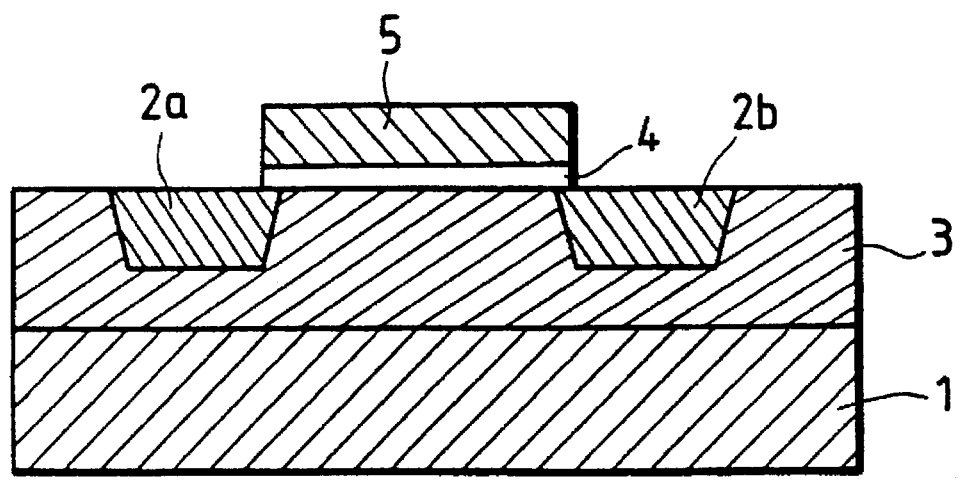

To achieve the above object of the present invention, the invention provides a manufacturing method for a semiconductor device, comprising at least the steps of: forming a gate electrode on a substrate by using a light-intercepting material; forming a gate insulating film on the substrate including the gate electrode; forming a semiconductor layer on the gate insulating film; and forming a source region and a drain region by virtue of the fact that light, having a wavelength such that the light is absorbed into the semiconductor layer, while not being absorbed into the substrate, is irradiated from the back of the substrate, before supplying impurities into the semiconductor layer.

In the foregoing manufacturing method, in order to supply impurities into the above semiconductor layer, it is desirable that a gas containing impurities, which is used as an impurity source, be introduced during light irradiation.

Furthermore, in the aforesaid manufacturing method, to feed impurities into above-mentioned semiconductor layer, it is also desirable that impurities or a substance containing impurities, which is used as an impurity source, be previously deposited on the semiconductor layer.

The wavelength of light to be irradiated is appropriately determined by a band gap of a semiconductor being employed, such as a semiconductor using Si or GaAs. For instance, when Si is employed for the semiconductor layer, light with a wavelength not more than that of blue color light may be preferably used, or more preferably ultraviolet rays may be used.

The essential point regarding the above light is to use light with a wavelength such that the light is mainly absorbed into the semiconductor layer, and impurities are diffused into the part which has been irradiated by the light.

In addition, though light may be irradiated continuously, irradiating the light in a so-called pulse-like manner (or intermittently) is a more preferable irradiating method, since it does not adversely affect a substrate with insufficient heat resistance, such as, in particular, a glass substrate.

Materials which do not absorb the above light and which are capable of functioning as a gate electrode, may be utilized as a gate electrode. For example, metals such as Al and W, or alloys containing such metals, may be utilized.

As described above, according to the present invention, it is possible to form a TFT by the self alignment process without being accompanied by a high temperature process. This is because the source and drain regions are formed by virtue of the fact that light, with a wavelength such that it is absorbed into the above semiconductor layer while not being absorbed into the substrate, is irradiated from the back of the substrate, while at the same time impurities are supplied from the above-described surface of the semiconductor.

Thus, in accordance with the present invention, since impurity diffusion in a horizontal direction hardly takes place, it is possible to eliminate the occurrence of parasitic capacitance, thereby allowing high drive speeds.

Moreover, since the high temperature process is not required for the entire device, the use of a commonly employed glass substrate, serving as a transparent substrate, permits the semiconductor device to be manufactured at a lower cost.

The preferred embodiments of the present invention will be described hereinafter with the accompanying drawings.

(First Embodiment)

As a preferred embodiment of the present invention, a description will be given of a method in which a gas containing impurities is introduced together with light irradiation in order to supply the impurities from the side of a semiconductor surface.

This embodiment will now be described according to a manufacturing process with reference to FIG. 3 through 5.

Figure 3:
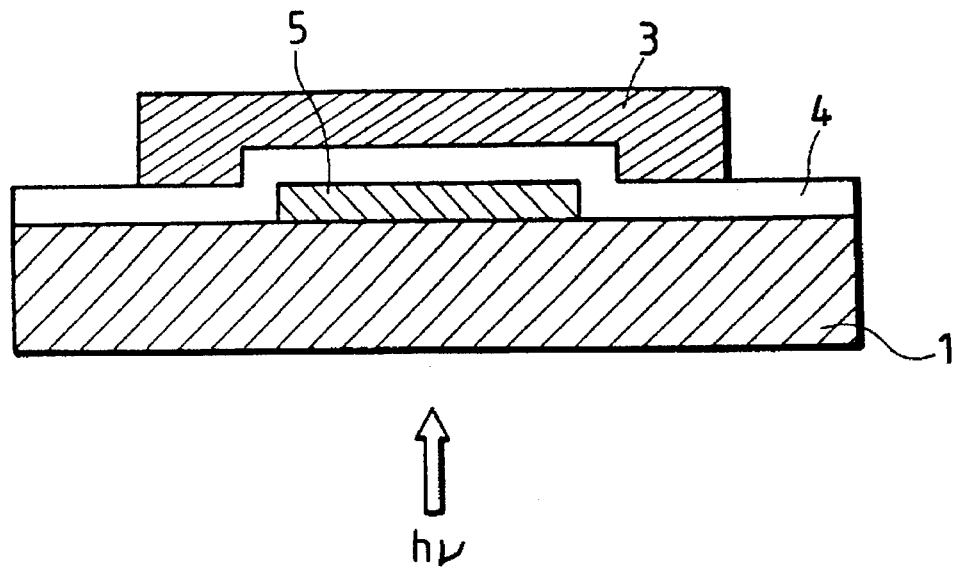
FIGS. 3 through 5 are respectively schematic cross-sectional views explaining the manufacturing process of a semiconductor device in accordance with a preferred embodiment of the present invention.
Figure 4:
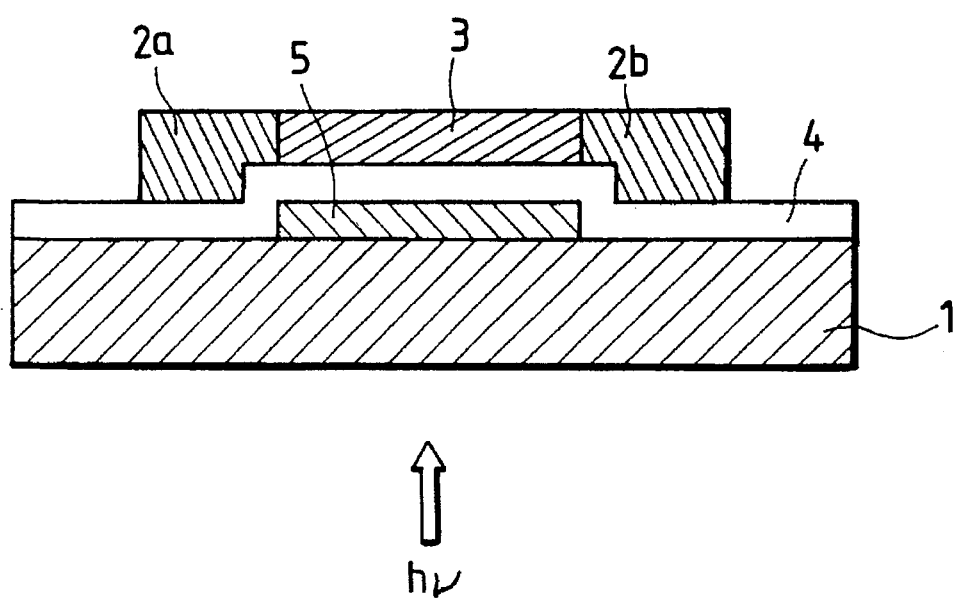

(1) First, as illustrated in FIG. 3, a spattering method is utilized to deposit 1000 Å $WSi_2$ on a quartz substrate 1. A gate electrode 5 is then formed by patterning the $WSi_2$ with the aid of commonly employed photolithography etching.

(2) Next, $SiH_4$ is allowed to react with $N_2O$ by using a plasma CVD method to deposit a 500 Å $SiO_2$ film, which will serve as a gate insulating film 4.

(3) A semiconductor layer 3 is formed by depositing a 1000 Å thick polycrystal silicon, whose impurity atom concentration is $1\times10^{15}$ atms/cm$^3$. The deposition is made by reacting $SiH_4$ with $PH_3$ at 650° C. using a vacuum CVD method.

(4) The above substrate 1 is arranged in a vacuum container in which the pressure is adjusted to 5 torrs by introducing $B_2H_6$. Eximer laser light (wave-length 193 nm) using an ArF gas is then collected into a 10×10 mm area. The collected light is irradiated from the back of the substrate 1 through a quartz window of the vacuum container (the irradiation is in the direction indicated by an arrow in the middle of FIG. 4). This light irradiation is performed by scanning the light across the entire face of the substrate 1. This heats the part of the semiconductor layer which has been irradiated by the light, and boron (B) is impurity-diffused into only a source region 2a as well as a drain region 2b. Such conditions are shown in FIG. 4.

Figure 5:
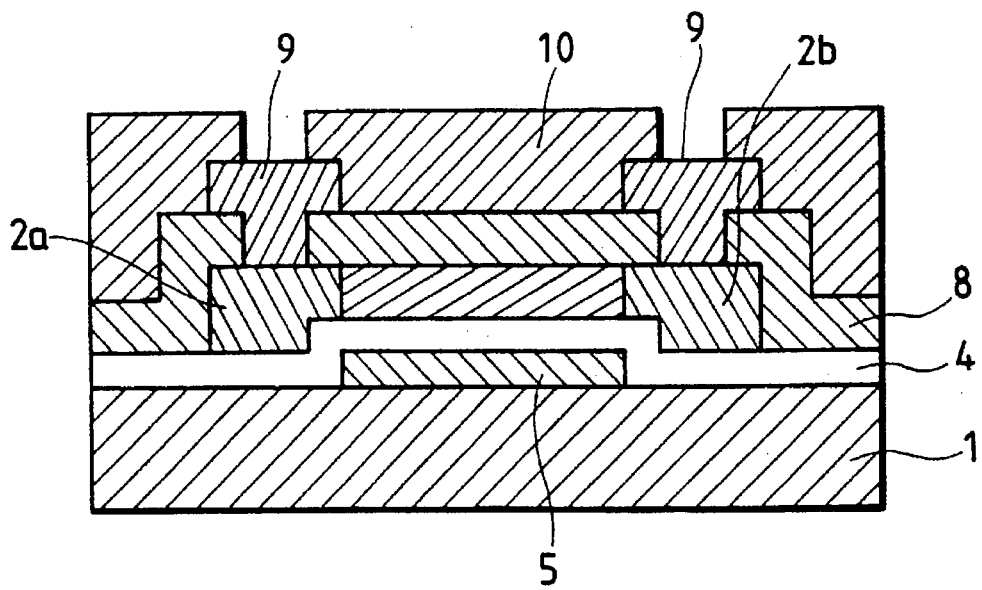

(5) As illustrated in FIG. 5, insulating films between layers 8 are formed by an ordinary IC process, and contact holes are formed in the source and drain regions of the insulating films between layers 8.

(6) After Al—Si is deposited to a thickness of 10000 Å by means of the spattering method, a source electrode 9 and a drain electrode 9 are formed by patterning the Al—Si.

(7) Lastly, as a protective film 10, 7000 Å of PSG (phosphsilicate glass) is deposited, thus completing a TFT.

On the thus formed source and drain regions of the TFT, the impurity atom concentration is $1\times10^{21}$ atms/cm$^3$ and the sheet resistance is 30 Ω/□. Furthermore, the Al—Si forming the electrodes exhibits favorable ohmic junction characteristics.

(Second Embodiment)

As a second preferred embodiment of the present invention, a description will be given of a method in which as a means of supplying impurities from the side of the surface of a semiconductor, impurities or a substance containing impurities is previously deposited on a semiconductor layer, which is used as an impurity source.

Figure 6:
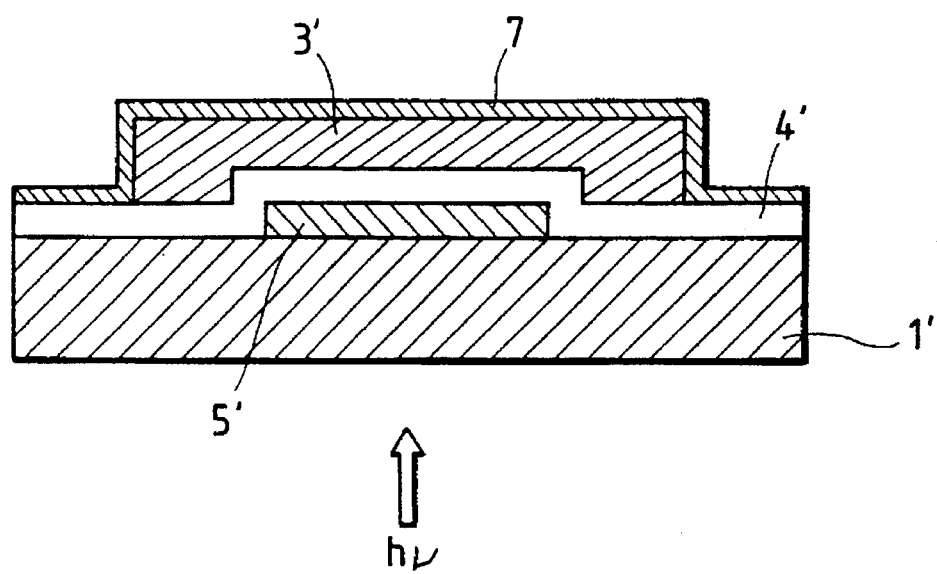
FIG. 6 is a schematic cross-sectional view explaining the manufacturing process of a semiconductor device in accordance with another preferred embodiment of the invention.

This embodiment will now be described according to a manufacturing process with reference to FIG. 6.

(1) Through the use of $WF_6$ and $SiH_4$, 1000 Å thick $WSi_2$ is caused to be deposited on a quartz substrate 1'. A gate electrode 5' is then formed by performing an ordinary photolithography etching.

(2) After $SiH_4$ is reacted with $N_2O$ by a photo-CVD method, a gate insulating film 4' is formed by depositing a 500 Å thick layer of $SiO_2$.

(3) A semiconductor layer 3' is formed in the following manner. Polycrystalline silicon with impurity atom concentration of $1\times10^{15}$ atms/cm$^3$ is caused to be deposited to a thickness of 1000 Å. The deposition is made by reacting $SiH_4$ with $H_2$ and $PH_3$ at 650° C., using a vacuum CVD method. After this, the polycrystal silicon layer is non-crystallized by an ion implantation using $Si^+$, and then is made into a branch-like crystal having a grain radius of 1–3 μm by performing a solid phase crystal growth in a heat treatment of 600° C.

(4) In the vacuum container, a boron (B) film 7 is formed by decomposing a mixed gas of $B_2H_6$ and Ar using plasma discharging.

(5) In the vacuum container, the eximer laser (wavelength 308 nm) using an XeCl gas is utilized to be irradiated from the back of the substrate 1'. This heats the part of the semiconductor layer which has been irradiated by light, and boron (B) is impurity-diffused into only those parts which will act as a source region and a drain region.

(6) After the above, as in the same way with the first embodiment, insulating films between layers, a source electrode, a drain electrode and a protective film are deposited in order to complete a TFT.

On the thus formed surfaces of the source and drain regions of the TFT, the impurity atom concentration is not less than $2\times10^{20}$ atms/cm$^3$ and the sheet resistance is 40 $\Omega/\square$. The Al—Si serving as the electrodes forms excellent ohmic contact.

As has been described, according to the present invention, it is possible to form the source and drain regions of TFT by the self alignment, owing to the fact that the regions are formed by the so-called laser doping, in which light is irradiated from the back of the substrate. Also, it is possible to manufacture TFTs with no parasitic capacity which permits high speed operations, because of no impurity diffusion into a horizontal direction.

Furthermore, the manufacturing process in which temperature may be lowered is capable of being simplified, since a heat treatment, required for activation after impurities are injected, is not required, as compared with a method which employs the ion implantation, which does require a heat treatment.

In addition, the manufacturing process can be further simplified, because etching is not necessary for the gate insulating film, as opposed to the laser doping in which light is irradiated from the surface of the substrate.

A semiconductor layer onto which light is irradiated is not necessarily polycrystalline, but it may be amorphous or single crystalline, so long as the impurity doping is carried out by irradiating light as desired.

As many widely different embodiments of the present invention can be made without departing from the spirit and scope thereof, it is to be understood that the invention is not limited to the specific embodiments thereof except as defined in the appended claims.

What is claimed is:

1. A manufacturing method for a semiconductor device, comprising the steps of:

forming a gate electrode by using light-intercepting material intercepting laser light of a wavelength shorter than a blue light wavelength on a first side of a transparent substrate;

forming a gate insulating film upon the substrate and the gate electrode;

forming a polycrystalline silicon semiconductor layer in an island-shape region to cover said gate electrode on the gate insulating film; and placing the polycrystalline silicon semiconductor layer within a gas atmosphere including an impurity in order to introduce the impurity into the polycrystalline silicon semiconductor layer, and irradiating, in a scanning manner, a second side of the polycrystalline silicon substrate with laser light having a wavelength which is shorter than a blue-light wavelength and which is absorbed mainly in the semiconductor layer, rather than being absorbed in the substrate, for heating the semiconductor layer so that the impurity in the gas atmosphere is thermally diffused from a surface of the semiconductor layer into the polycrystalline silicon semiconductor layer, to produce a source and a drain region.

2. A method according to claim 1, wherein said light irradiation is performed intermittently.

3. A method according to claim 1, wherein said light transparent substrate includes glass.

4. A method according to claim 3, wherein said light transparent substrate includes quartz glass.

5. A method according to claim 1, wherein the atmosphere including the impurity includes B atoms.

6. A method according to claims 1, wherein said irradiating step and said impurity introducing step are performed simultaneously.

7. A method according to claim 1, further comprising the step of forming electrodes respectively on said source and drain regions.

8. A manufacturing method for semiconductor device, comprising the steps of:

forming a gate electrode on a first side of a substrate by using a light-intercepting material intercepting laser light of wavelength shorter than a blue light wavelength;

forming a gate insulating film on the substrate including the gate electrode;

forming a polycrystalline silicon semiconductor layer island-shaped region covering said gate electrode on the gate insulating film;

injecting a silicon ion into the polycrystalline silicon semiconductor layer to convert the polycrystalline silicon semiconductor layer into an amorphous silicon semiconductor layer;

thermally processing the amorphous silicon for solid-state growth to form a semiconductor layer having dendrite crystal;

forming a boron film on a surface of said semiconductor layer having the dendrite crystal; and intermittently irradiating a second side of the substrate with laser light having a wavelength shorter than a blue-light wavelength such that the laser light is absorbed into the semiconductor layer, while not being substantially absorbed into the substrate, to heat the semiconductor layer, so that the boron from the boron film is thermally diffused as an impurity through the surface of the semiconductor layer into the semiconductor layer, to form a source region and a drain region.

9. A method according to claim 8, wherein the transparent substrate includes glass.

10. A method according to claim 9, wherein the glass includes quartz glass.

* * * * *

UNITED STATES PATENT AND TRADEMARK OFFICE
CERTIFICATE OF CORRECTION

PATENT NO. : 5,656,511

DATED : August 12, 1997

INVENTOR(S): HITOSHI SHINDO

It is certified that error appears in the above-identified patent and that said Letters Patent is hereby corrected as shown below:

COLUMN 1

Line 55, "followed" should read --followed by--.

COLUMN 2

Line 17, "ity." should read --itance.--.

COLUMN 4

Line 5, "torrs" should read --Torr--;
Line 6, "Eximer" should read --Excimer--;
Line 60, "eximer" should read --excimer--.

COLUMN 5

Line 13, "capacity" should read --capacitance--.

UNITED STATES PATENT AND TRADEMARK OFFICE
CERTIFICATE OF CORRECTION

PATENT NO. : 5,656,511

DATED : August 12, 1997

INVENTOR(S): HITOSHI SHINDO

It is certified that error appears in the above-identified patent and that said Letters Patent is hereby corrected as shown below:

COLUMN 6

Line 14, "claims 1," should read --claim 1,--.
Line 20, "semiconductor" should read --a semiconductor--.

Signed and Sealed this

Thirtieth Day of June, 1998

Attest:

BRUCE LEHMAN

Attesting Officer

Commissioner of Patents and Trademarks